(12) United States Patent
Doyle et al.

(10) Patent No.: US 9,711,284 B2
(45) Date of Patent: Jul. 18, 2017

(54) STRUCTURE TO MAKE SUPERCAPACITOR

(71) Applicants: Brian S. Doyle, Portland, OR (US); Sasikanth Manipatruni, Hillsboro, OR (US); Shawna M. Liff, Gilbert, AZ (US); Vivek K. Singh, Portland, OR (US)

(72) Inventors: Brian S. Doyle, Portland, OR (US); Sasikanth Manipatruni, Hillsboro, OR (US); Shawna M. Liff, Gilbert, AZ (US); Vivek K. Singh, Portland, OR (US)

(73) Assignee: Intel Corporation, Santa Clara, CA (US)

(*) Notice: Subject to any disclaimer, the term of this patent is extended or adjusted under 35 U.S.C. 154(b) by 472 days.

(21) Appl. No.: 13/711,531

(22) Filed: Dec. 11, 2012

(65) Prior Publication Data
US 2014/0160628 A1   Jun. 12, 2014

(51) Int. Cl.
| | |
|---|---|
| *H01G 4/16* | (2006.01) |
| *H01G 4/30* | (2006.01) |
| *H01G 4/28* | (2006.01) |
| *H01L 29/06* | (2006.01) |
| *H01G 4/008* | (2006.01) |
| *B82Y 10/00* | (2011.01) |
| *H01L 49/02* | (2006.01) |
| *D03D 1/00* | (2006.01) |
| *H01L 29/775* | (2006.01) |

(52) U.S. Cl.
CPC .............. *H01G 4/008* (2013.01); *B82Y 10/00* (2013.01); *D03D 1/0088* (2013.01); *H01G 4/28* (2013.01); *H01L 28/60* (2013.01); *H01L 29/068* (2013.01); *H01L 29/0673* (2013.01); *H01L 29/775* (2013.01); *D10B 2401/18* (2013.01)

(58) Field of Classification Search
CPC ..... H01G 4/30; H01G 4/28; H01G 4/16; H01L 29/0657
USPC ........ 361/524, 324, 321.6; 174/85; 442/188, 442/330; 257/618
See application file for complete search history.

(56) References Cited

U.S. PATENT DOCUMENTS

| | | | |
|---|---|---|---|
| 2007/0126044 A1* | 6/2007 | Shioya | B82Y 10/00 257/306 |
| 2009/0166577 A1 | 7/2009 | Peng et al. | |
| 2010/0178418 A1* | 7/2010 | Tuncer | 427/79 |

FOREIGN PATENT DOCUMENTS

| | | |
|---|---|---|
| CN | 1979857 | 6/2007 |
| JP | 04-236411 A | 8/1992 |
| JP | 09-306781 A | 11/1997 |
| JP | H09296366 | 11/1997 |
| JP | 2006230033 | 8/2006 |
| JP | 2007184554 | 7/2007 |
| JP | 2007314925 | 12/2007 |

(Continued)

OTHER PUBLICATIONS

PCT International Preliminary Report and Written Opinion for PCT/US2013/047390, mailed Jun. 16, 2015, (8 pages).

(Continued)

*Primary Examiner* — Eric Thomas
*Assistant Examiner* — Arun Ramaswamy
(74) *Attorney, Agent, or Firm* — Blakely, Sokoloff, Taylor & Zafman LLP

(57) ABSTRACT

A charge storage fiber is described. In an embodiment, the charge storage fiber includes a flexible electrically conducting fiber, a dielectric coating on the flexible electrically conducting fiber, and a metal coating on the dielectric coating. In an embodiment, the charge storage fiber is attached to a textile-based product.

14 Claims, 20 Drawing Sheets

(56) References Cited

FOREIGN PATENT DOCUMENTS

| | | |
|---|---|---|
| JP | 201021168 | 2/2010 |
| JP | 2010-021168 A | 7/2010 |
| JP | 2012186233 | 9/2012 |
| TW | 200923991 | 6/2009 |
| WO | WO 96-33427 A1 | 10/1996 |

OTHER PUBLICATIONS

The Office Action for counterpart Japanese Application No. 2015-541760, 7 pages, mailed Jul. 4, 2016 including translation.
The Office Action and Search Report for counterpart Taiwan Application No. 102139955, 22 pages, mailed Apr. 6, 2016 including translation.
Diesing, D., et al., "Aluminium oxide tunnel junctions: influence of preparation technique, sample geometry and oxide thickness", Thin Solid Films, vol. 342, Issue 1-2, pp. 282-290, Mar. 1999.
The Office Action for counterpart Chinese Application No. 201380058820, 10 pages, mailed Dec. 29, 2016.
Creager, Stephen E., et al., "Fibers for Textile-Based Electrical Energy Storage," NTC-Project M06-CL07, National Textile Center Annual Report, Nov. 2006, pp. 1-9.
Creager, Stephen E., et al., "Fibers for Textile-Based Electrical Energy Storage," NTC-Project: M06-CL07, National Textile Center Research Briefs, Jun. 2008, pp. 1-3.
PCT International Search Report and Written Opinion for International Application No. PCT/US2013/047390, mailed Oct. 10, 2013, 12 pages.
The Office Action for counterpart Korean Application No. 10-2015-7010163, 4 pages, mailed Oct. 26, 2016 including translation.

* cited by examiner

ELECTRIC CURRENT FLOWS TO CHARGE CAPACITOR

CHARGE STORED IN CAPACITOR UNTIL NEEDED

ELECTRIC CURRENT FLOWS FROM CHARGE CAPACITOR TO DEVICE NEEDING CHARGING

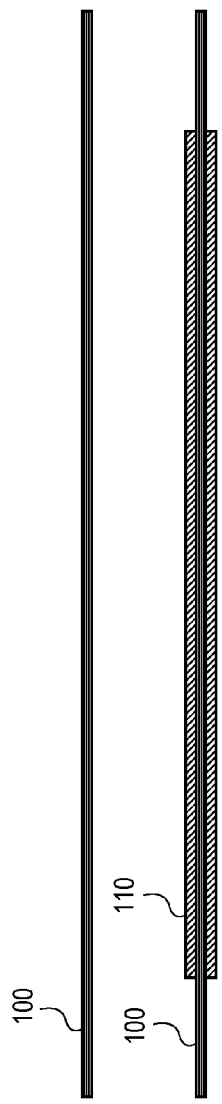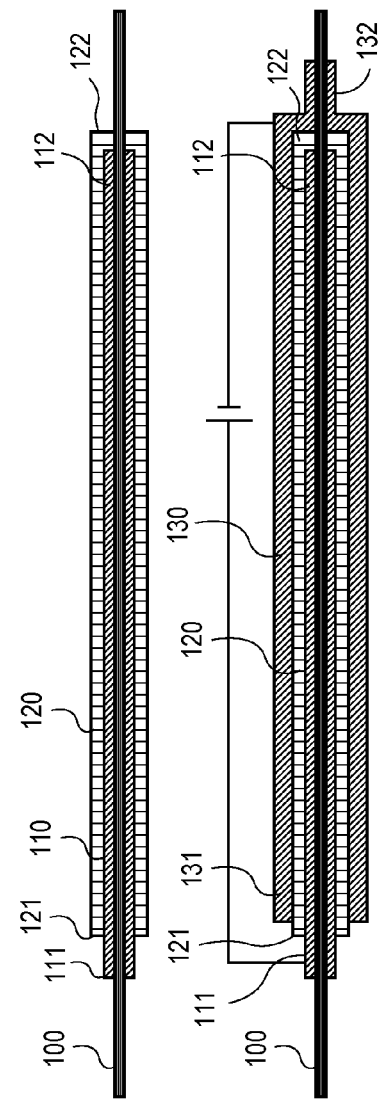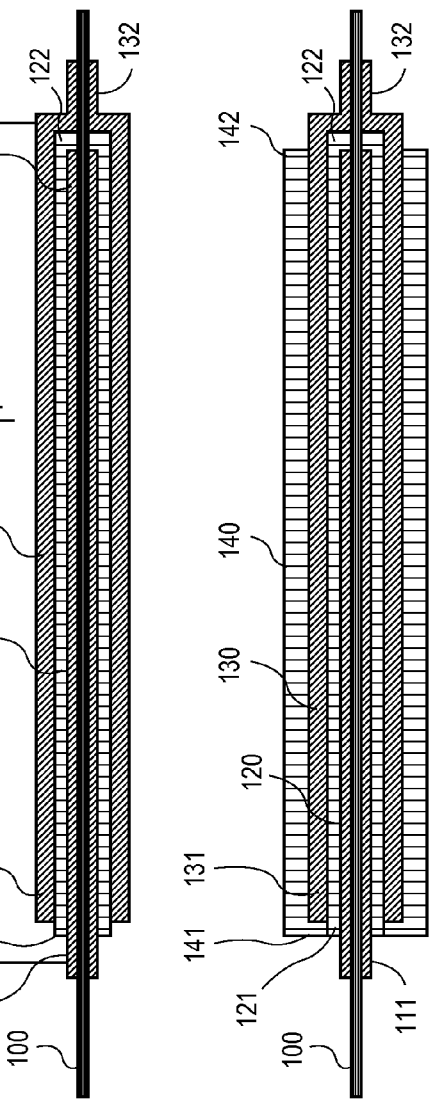

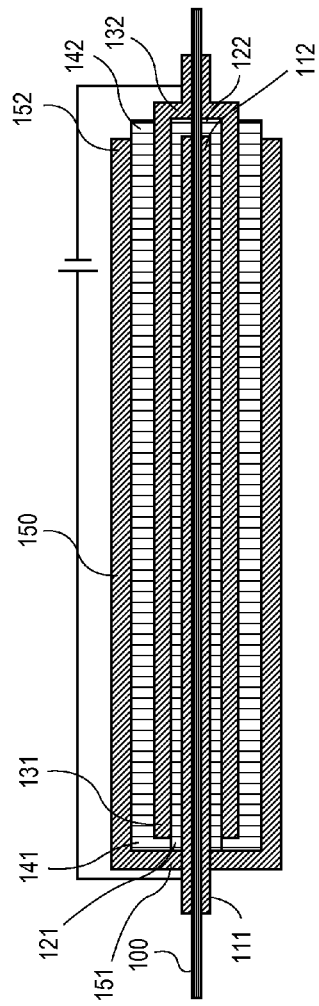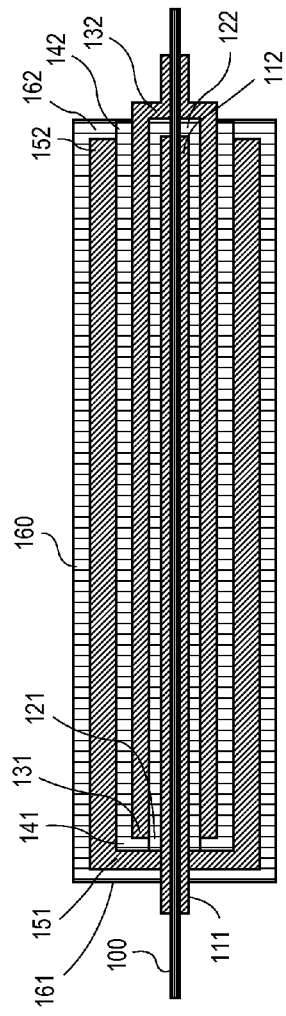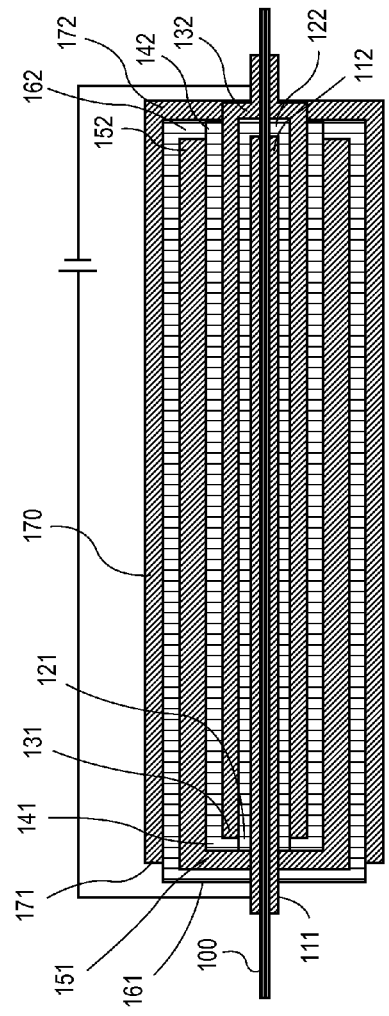

STRUCTURE TO MAKE SUPERCAPACITOR

BACKGROUND OF THE INVENTION

Field of the Invention

The present invention relates to supercapacitors for portable electronics devices, and more particularly for wearable electronics devices.

Discussion of Related Art

Portable electronics devices are often held in the hand, strapped onto belts, etc. and tend to be bulky. Portable electronics also rely on battery power when a power outlet or portable generator is not available. Combined with the compact size of many portable electronics devices, this often means expensive batteries must be used to power the portable electronics devices. The batteries also need to be charged regularly.

BRIEF DESCRIPTION OF THE DRAWINGS

FIGS. 19A-19H are cross-sectional side view illustrations of a method of forming inter-digitated capacitors in accordance with embodiments of the invention.

DETAILED DESCRIPTION OF THE PRESENT INVENTION

Figure 2:
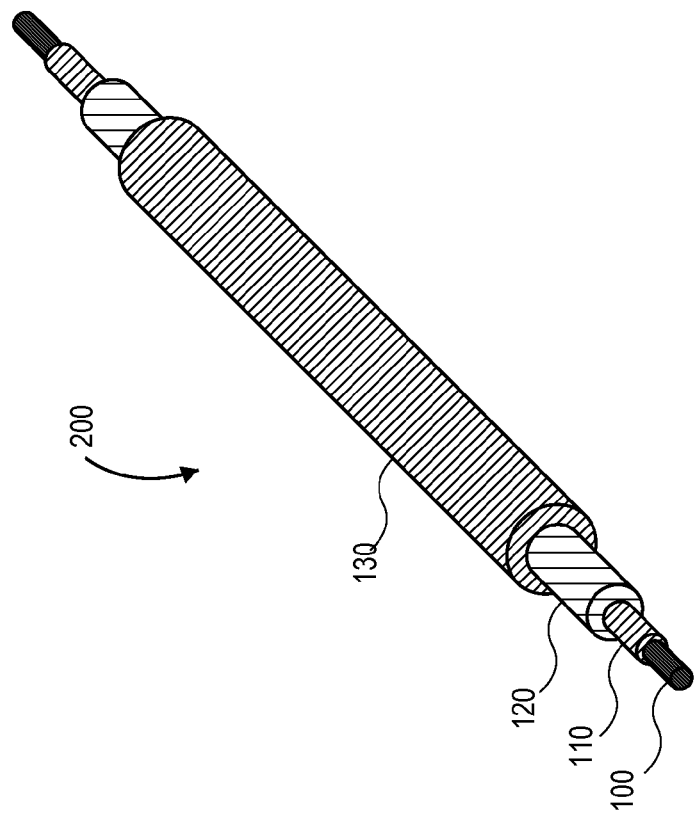
FIG. 2 is a perspective view illustration of a single wire capacitor in accordance with embodiments of the invention.

In various embodiments, charge storage fibers and methods of formation are described with reference to figures. However, certain embodiments may be practiced without one or more of these specific details, or in combination with other known methods and materials. In the following description, numerous specific details are set forth, such as specific materials, dimensions and processes, etc., in order to provide a thorough understanding of the present invention. In other instances, well-known semiconductor processes and manufacturing techniques have not been described in particular detail in order to not unnecessarily obscure the present invention. Reference throughout this specification to "an embodiment" means that a particular feature, structure, material, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, materials, or characteristics may be combined in any suitable manner in one or more embodiments.

In one aspect, embodiments of the invention integrate semiconductor manufacturing technologies such as chemical vapor deposition (CVD) and atomic layer deposition (ALD) into a processing sequence for forming flexible charge storage fibers. In utilizing embodiments of the invention, it is expected that a simple single wire supercapacitor structure including a metal-insulator-metal (MIM) capacitor structure wrapped around a flexible fiber can achieve up to approximately 50 femtofarad per square micron (50 $fF/\mu m^2$) of flexible fiber surface. For example, an exemplary size 69 nylon flexible fiber has a diameter of 0.25 mm (0.8 mm circumference). Assuming 80 threads/cm of this fiber is woven in each the x and y directions (single ply), and one square meter surface area of woven thread, this yields a capacitance of 0.25 F for a single layer MIM supercapacitor structure. By increasing the number of capacitor layers, the capacitance can be increased by 0.25 F for each layer. In this manner, the flexible charge storage fibers may be used as the fabric of clothing itself, or attached to the clothing for either charging of portable electronics devices or as part of the portable electronics devices themselves.

In another aspect, some embodiments of the invention describe manners of forming specific fiber components using flexible electrically conducting fibers. For example, flexible electrically conducting fibers can be coated fiber structures or uncoated fiber structures. In an embodiment the flexible electrically conducting fiber can include an insulating flexible fiber coated with a metal coating or semiconducting coating. In an embodiment, a flexible electrically conducting fiber can be a flexible metal wire or a flexible semiconducting nanowire. A variety of configurations are envisioned in accordance with embodiments of the invention.

Figure 1:
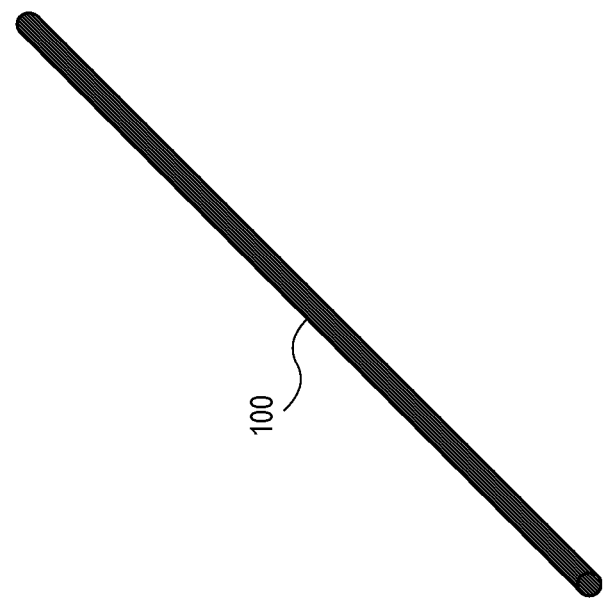
FIG. 1 is a perspective view illustration of a flexible fiber in accordance with embodiments of the invention.

Referring now to FIG. 1, a perspective view illustration is provided of a flexible fiber in accordance with embodiments of the invention. Flexible fiber 100 may be formed of a variety of suitable textile materials which are capable of withstanding minimum deposition temperatures of semiconductor device manufacturing equipment such as chemical vapor deposition (CVD) or atomic layer deposition (ALD) equipment of at least 100° C. CVD and ALD deposition techniques may be particularly suitable in order to provide a reproducible, uniform coating around the circumference of the flexible fibers. A non-exclusive list of suitable flexible fiber materials is provided in Table 1, along with available information for melting temperature, softening/sticking temperature, and a safe ironing temperature for the fabric, all in degrees Celsius.

TABLE 1

| Material | $T_{melting}$ | $T_{soft/stick}$ | $T_{Safe\ Ironing}$ | Notes |
|---|---|---|---|---|
| Acrylic | | 204-254 | 149-176 | |
| Rayon | n/a | | 191 | |
| Aramid | n/a | n/a | n/a | Carbonizes at T > 425 C. |
| Spandex | 230 | 175 | 149 | |
| Acetate | 230 | 184 | 177 | |
| Arnel Triacetate | 302 | 250 | 240 | |
| glass | >700 | | | |
| vinyon | 140 | 93 | do not iron | |
| Novoloid | n/a | | | |
| Polyphenylene benzobisoxazole | | | | Continuous operation capable at T > 280 C. |
| Polybenzimidazole | n/a | | | Continuous operation capable at 250 C. |
| Polyimide (e.g. P-84) | | | | Continuous operation capable at 260 C. |
| Olefin | 135 | 127 | 66 | |
| Polyester PET | 249 | 238 | 163 | |
| Polyester PCDT | 311 | 254 | 177 | |
| Saran | 177 | 149 | do not iron | |
| Polytetrafluoro-ethylene (PTFE) | 327 | | | |
| Nylon-6,6 | 250 | 229 | 177 | |
| Polyethylene terephthalate (PET) | 265 | | | |
| Cotton | n/a | | 218 | |
| Flax | n/a | | 232 | |
| Wool | n/a | | 149 | |
| Silk | n/a | | 149 | |
| Bamboo | 130-175 | | | |
| Nylon 6 | 212 | 171 | 149 | |

Referring now to FIG. 2, in accordance with embodiments of the invention a single wire capacitor 200 can be formed on the fiber 100 of FIG. 1. As illustrated a first metal (M1) coating 110 is deposited on the flexible fiber 100. A dielectric (E1) coating 120 is deposited on the first metal (M1) coating 110, and a second metal (M2) coating 130 is deposited on the E1 coating 120. The resultant structure may be a metal-insulator-metal (MIM) capacitor structure. In the exemplary embodiment where fiber 100 is formed of size 69 nylon with 0.25 mm diameter, the MIM part of the capacitor thickness may be 2,500 times thinner than the fiber 100. In such an embodiment, the MIM part including layers 110, 120, 130 is 0.1 µm thick.

M1 and M2 coatings 110, 130 may be formed of any suitable metal that can be deposited using CVD or ALD, such as, but not limited to, Ti, TiW, W, Ru, Al. E1 coating 120 may be formed of any suitable dielectric material for forming a capacitor and may include lower dielectric constant or high dielectric constant materials. For example E1 coating 120 may be formed of $SiO_2$, $SiN_x$, $TaO_2$, $HfO_2$, $ZrO_2$, $BaSrTiO_2$, PZT (lead zirconate titanate). The thicknesses of the metal and dielectric layers may be varied for a particular application, with thinner dielectric layers and dielectric layer with a higher dielectric constant providing higher capacitance (or supercapacitance) for the charge storage fiber.

Figure 3:
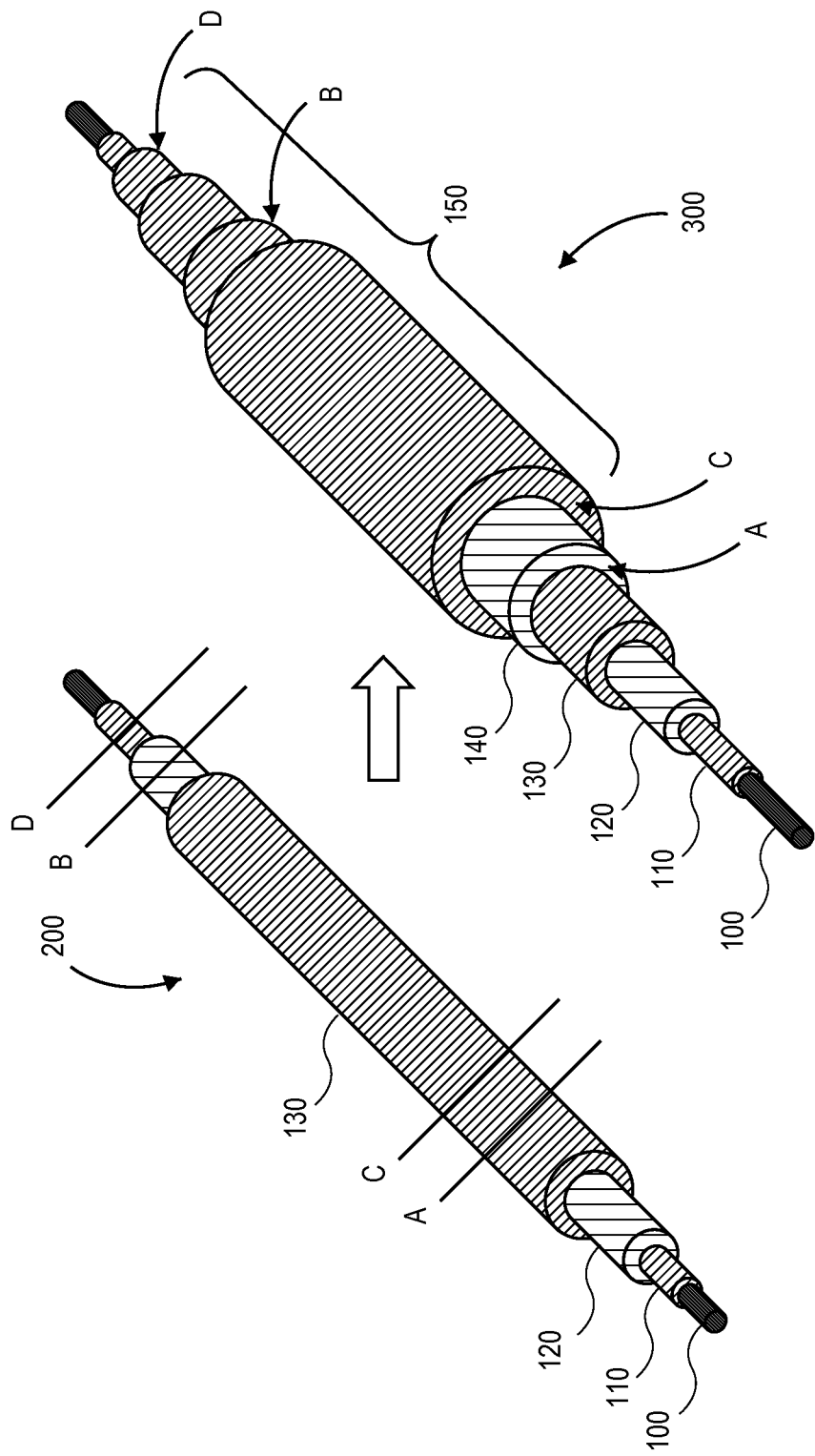
FIG. 3 is a perspective view illustration of a double wire capacitor in accordance with embodiments of the invention.

Referring now to FIG. 3, a double wire capacitor 300 can be formed on the single wire 200 capacitor of FIG. 2 in accordance with embodiments of the invention. In this manner, the capacitance achievable may be effectively doubled compared to a single wire capacitor. As shown, following the formation of M2 coating 130, a second dielectric (E2) coating 140 is formed on the M2 coating 130 and E1 coating 120 on the coating area between A-B. A third metal (M3) coating is then deposited on the E2 coating 140, E1 coating 120, and M1 coating 110 on the coating area between C-D. This effectively shorts the M1 coating 110 to the M3 coating 150 and forms a single electrode, the other electrode being the M2 coating 130 sandwiched between the E1/E2 coatings 120, 140 and electrically isolated from the M1 and M3 coatings 110, 150.

Figure 4:
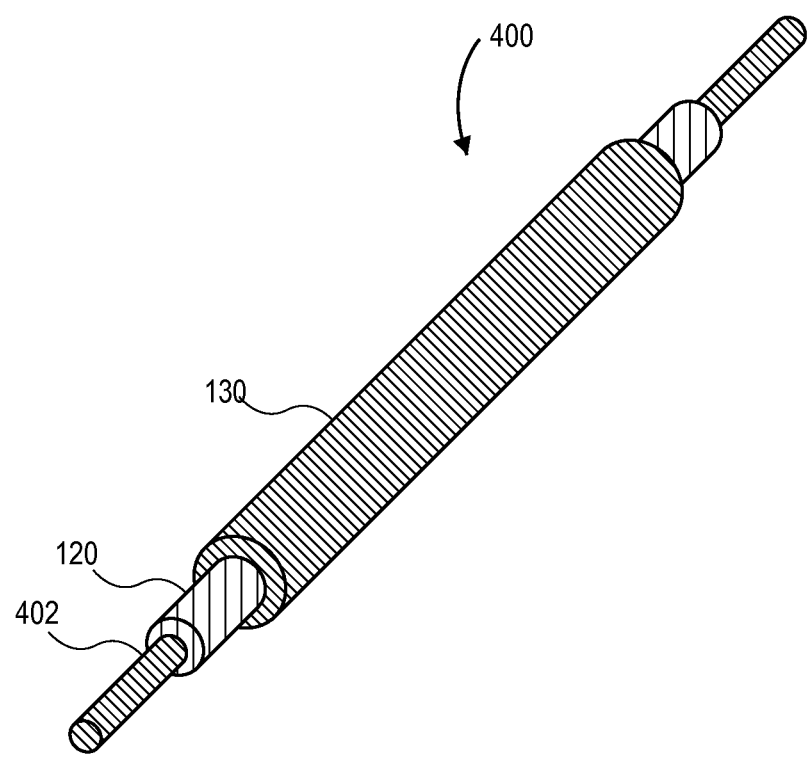
FIG. 4 is a perspective view illustration of a single wire capacitor in accordance with embodiments of the invention.

FIG. 4 is a perspective view illustration of a single wire capacitor 400 in accordance with embodiments of the invention. In the embodiment illustrated the innermost wire is a flexible metal wire 402. Flexible metal wire 402 may be formed of any metallic material, and may be formed by a variety of methods, including being drawn through a draw plate. Accordingly, flexible metal wire 402 may be formed of the same materials as M1 and M2 coatings 110, 130, as well as other materials, including copper. A dielectric (E1) coating 120 is deposited on the flexible metal wire 402, and a second metal (M2) coating 130 is deposited on the E1 coating 120.

Figure 5:
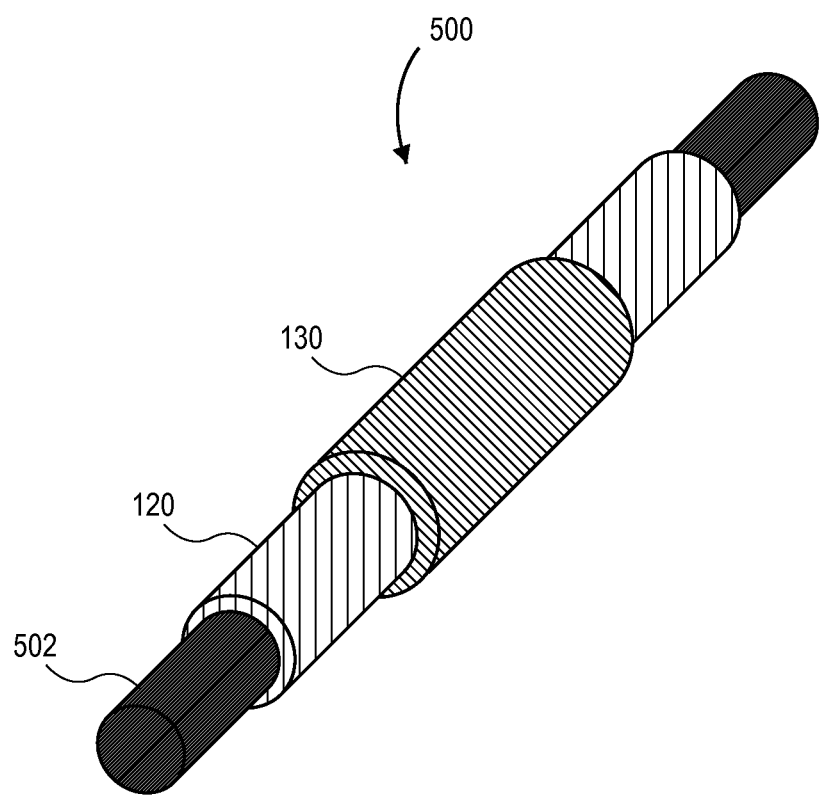
FIG. 5 is a perspective view illustration of a pass transistor in accordance with embodiments of the invention.

FIG. 5 is a perspective view illustration of a pass transistor 500 in accordance with embodiments of the invention. In the embodiment illustrated the innermost wire is a flexible semiconducting nanowire 502. In another embodiment, the flexible semiconducting flexible nanowire 502 may be substituted with a flexible fiber, such as a flexible insulating fiber, and semiconducting coating on the flexible fiber. Dielectric (E1) coating 120 and second metal (M2) coating 130 may be formed similarly as described above. In operation, the source and drain are on the central semiconducting nanowire 502 and the M2 coating functions as the gate. When the gate is turned on, current will be allowed to flow between the source/drain depending upon what components the pass transistor 500 is connected to. In one embodiment, the E1 coating 120 is formed of a material that responds to the ambient environment being detected. For example, the presence of a specific gas may cause electrical changes in the current between the drain and source. In this manner the pass transistor 500 component can function as a sensor. In accordance with embodiments of the invention, the pass transistor 500 may be a device in itself or connected to other devices to form some logic function.

Figure 6:
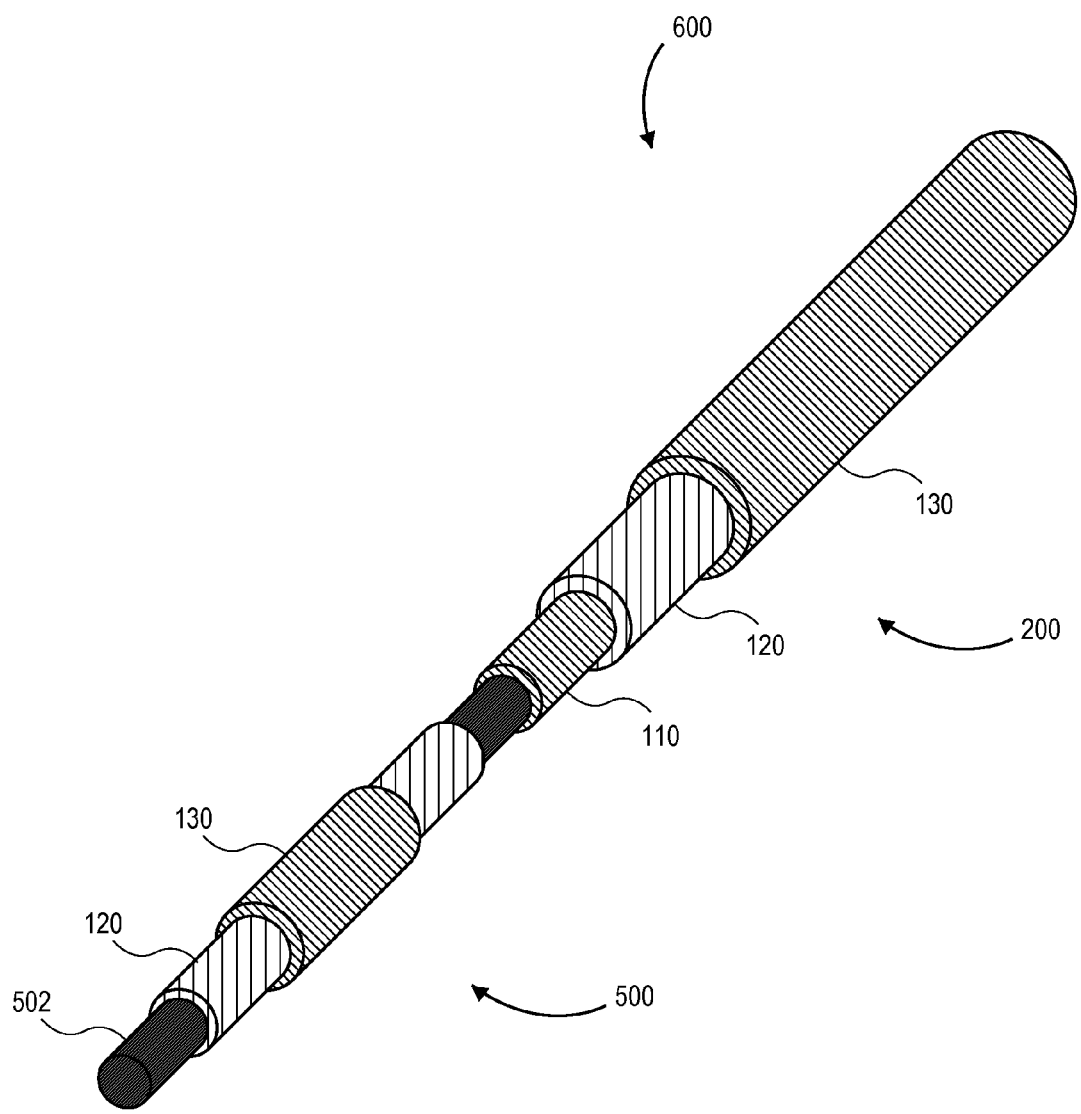
FIG. 6 is a perspective view illustration of a multi-component fiber in accordance with embodiments of the invention.

FIG. 6 is a perspective view illustration of a multi-component fiber 600 in accordance with embodiments of the invention. As illustrated, the multi-component fiber 600 includes a pass transistor 500 in serial connection along flexible semiconducting nanowire 502 with a capacitor 200. As shown, the pass transistor 500 may be the same pass transistor described with regard to FIG. 5, and the capacitor 200 may be the same single wire capacitor 200 as described with regard to FIG. 2, with the only difference being that the single wire capacitor 200 is formed on a flexible semiconducting nanowire 502, rather than flexible fiber 100. In other embodiments, the capacitor 200 may be other capacitors described in accordance with embodiments of the invention such as a double wire capacitor or inter-digitated capacitor.

Figure 7A:
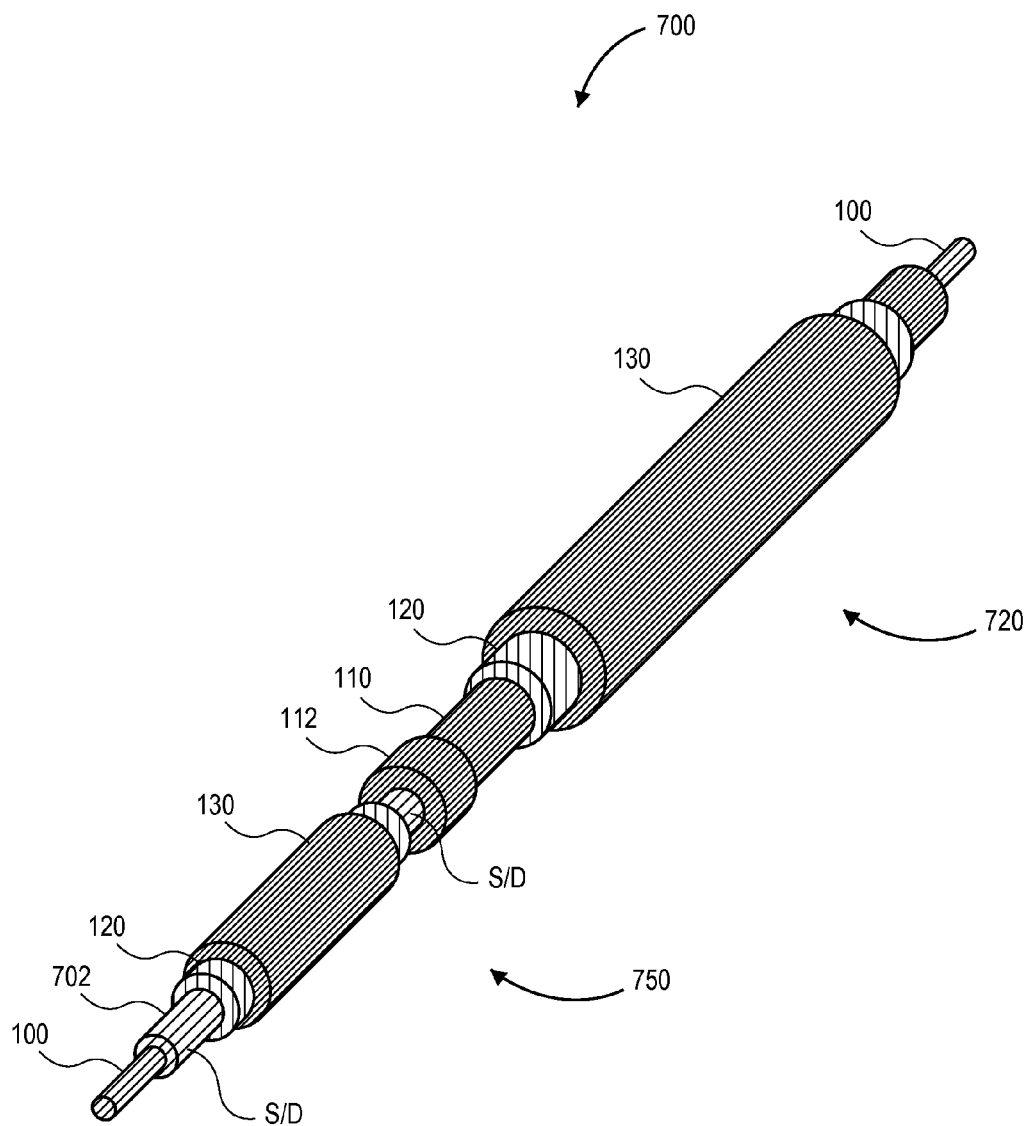
FIG. 7A is a perspective view illustration of a multi-component fiber in accordance with embodiments of the invention.

FIG. 7A is a perspective view illustration of a multi-component fiber 700 in accordance with embodiments of the invention. As illustrated, the multi-component fiber 700 includes a pass transistor 750 in serial connection along flexible fiber 100 with a capacitor 720. As shown the capacitor 720 may be similar to the single wire capacitor 200 as described with regard to FIG. 2. The pass transistor 750 may be similar to the pass transistor 500 described in FIG. 5, with the flexible semiconducting nanowire 502 being substituted with flexible fiber 100 and semiconducting coating 702. In operation, the source and drain are on the central semiconducting coating 702 and the M2 coating 130 functions as the gate. Also illustrated, in order to electrically connect the pass transistor 750 and capacitor 720, proximal portion 112 of first metal (M1) coating 110 of the capacitor 720 overlaps a source/drain portion of the central semiconducting coating 702 for pass transistor 750.

Figure 7B:
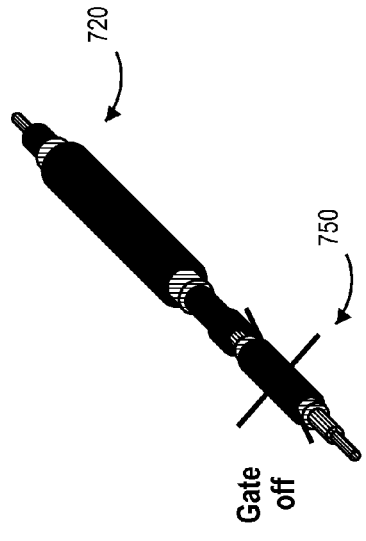
FIG. 7B is a perspective view illustration of electric current flowing to a capacitor in accordance with embodiments of the invention.
Figure 7C:
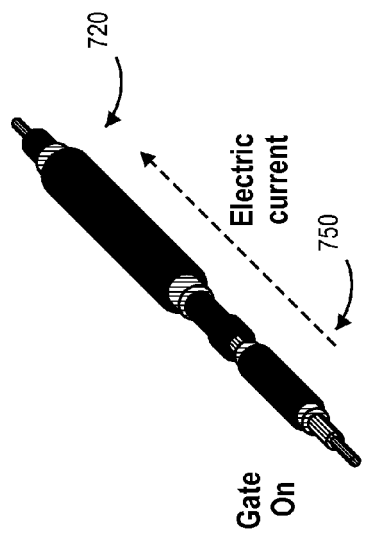
FIG. 7C is a perspective view illustration of charge stored in a capacitor in accordance with embodiments of the invention.
Figure 7D:
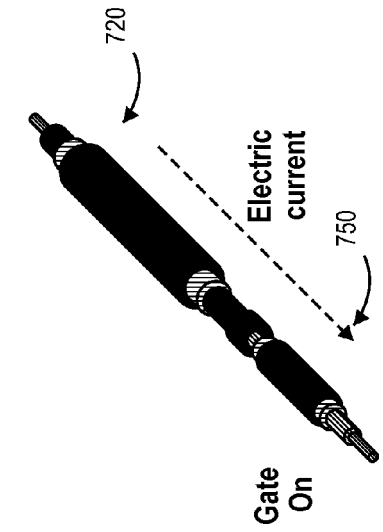
FIG. 7D is a perspective view illustration of electric current flowing from a capacitor in accordance with embodiments of the invention.

FIGS. 7B-7D are perspective views illustrating operation of a multi-component fiber 700 in accordance with embodiments of the invention. FIG. 7B illustrates the gate being turned on and electric current flowing through the pass transistor 750 to charge the capacitor 720. FIG. 7C illustrates the gate being turned off, where electric current does not flow through the pass transistor 750 and charge is stored in the capacitor 720 until needed. FIG. 7D illustrates the gate being turned on and electric current flowing through the pass transistor 750 from charge the capacitor 720 to a device needing charging.

Figure 8:
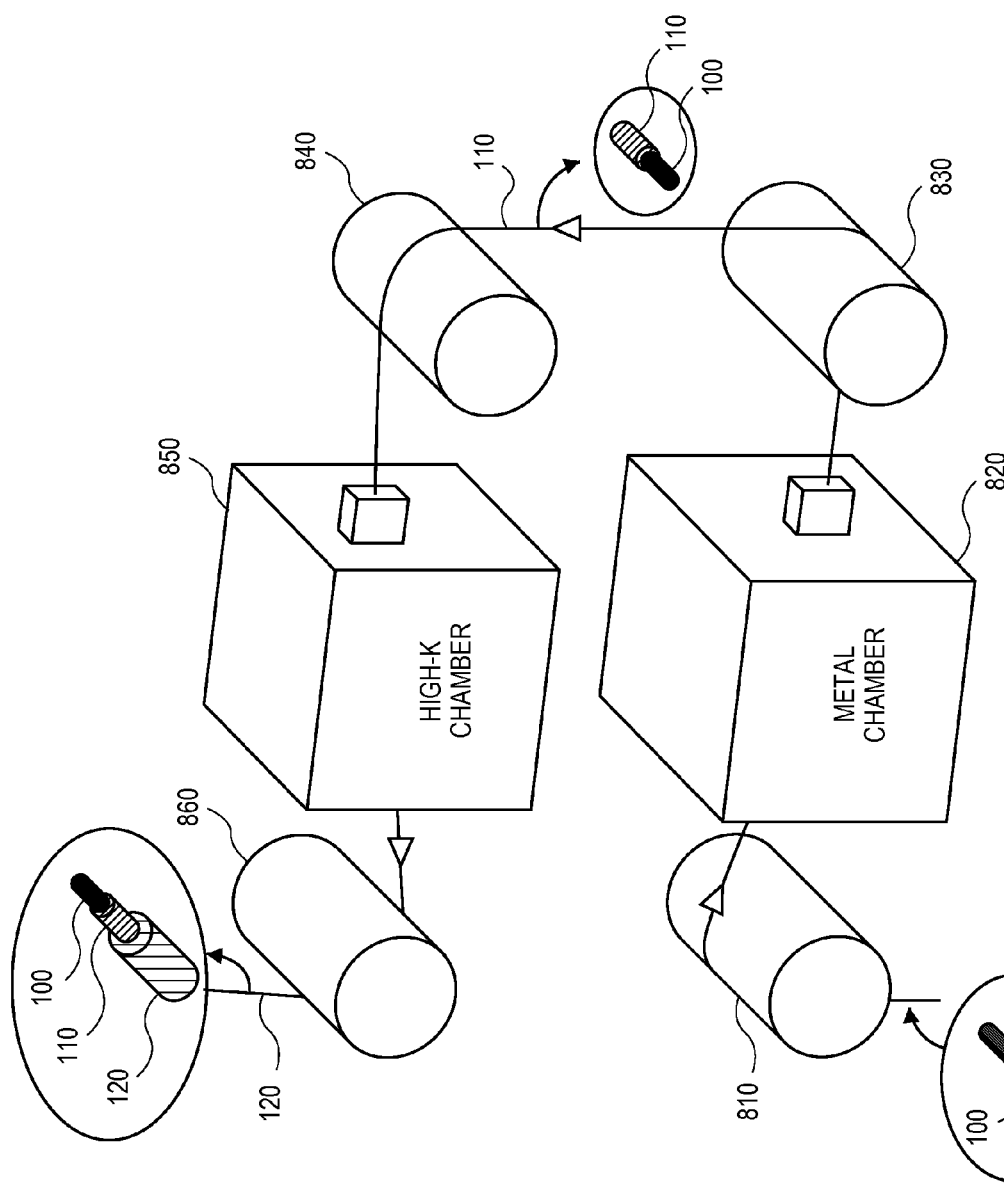
FIGS. 8-9 are perspective view illustrations of a system for fabricating a single wire capacitor in accordance with embodiments of the invention.
Figure 9:
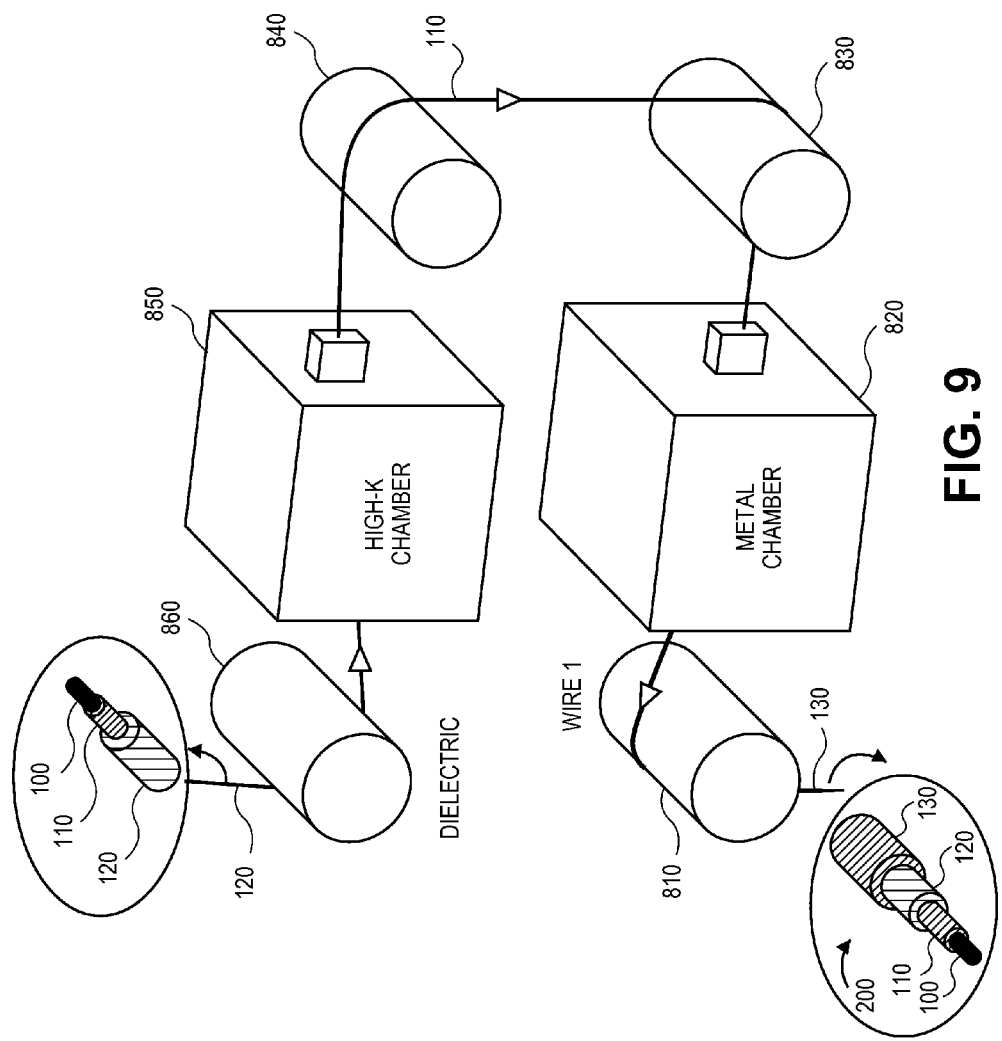

FIGS. 8-9 are perspective view illustration of a system for fabricating a single wire capacitor in accordance with embodiments of the invention. More particularly, such as system illustrates how a long charge storage fiber can be fabricated at low cost using an ALD/CVD deposition system in which a full length of flexible fiber 100 is passed sequentially through one or more metal deposition chambers 820 and dielectric deposition chambers 850, whose precursor gases are turned on and off as the fiber passes through the deposition system depending on whether a deposition is required or not. Referring to FIG. 8, beginning at the bottom of the illustration, fiber 100 is drawn over roller 810 and into metal deposition chamber 820 to deposit the M1 coating 110. The fiber can then be drawn over rollers 830, 840, and into dielectric deposition chamber 850, which may deposit a variety of dielectric materials, including high-K dielectrics, to form E1 coating 120 on the M1 coating 110. As shown, the distal portion of the M1 coating 110 may be drawn slightly past the dielectric deposition chamber 850 prior to depositing the E1 coating 120. Referring now to FIG. 9, the fiber may be drawn in the opposite direction. In the embodiment illustrated the fiber is drawn back through the dielectric deposition chamber 850 and into the metal deposition chamber 820 to deposit the M2 coating 130, resulting in the single wire capacitor 200. As shown, the proximal portion of the E1 coating 120 (i.e. the portion of the fiber first re-entering metal deposition chamber 820 in the direction indicated in FIG. 9) may be drawn slightly past the metal deposition chamber 820 prior to depositing the M2 coating 130 in order to avoid shorting between the M1 coating 110 and M2 coating 130. While the system illustrated and described with regard to FIGS. 8-9 utilizes a single metal deposition chamber 820 and single dielectric deposition chamber 850, it is to be understood that such an arrangement is exemplary, and that other arrangements are contemplated in accordance with embodiments of the invention. For example, the fiber may be drawn in a single direction through a metal deposition chamber, dielectric deposition chamber, and second metal deposition chamber rather than changing directions. The fibers may also be looped through the system. Likewise, the roller 810, 830, 840, 860 configuration is meant to be exemplary and not limiting.

Figure 10:
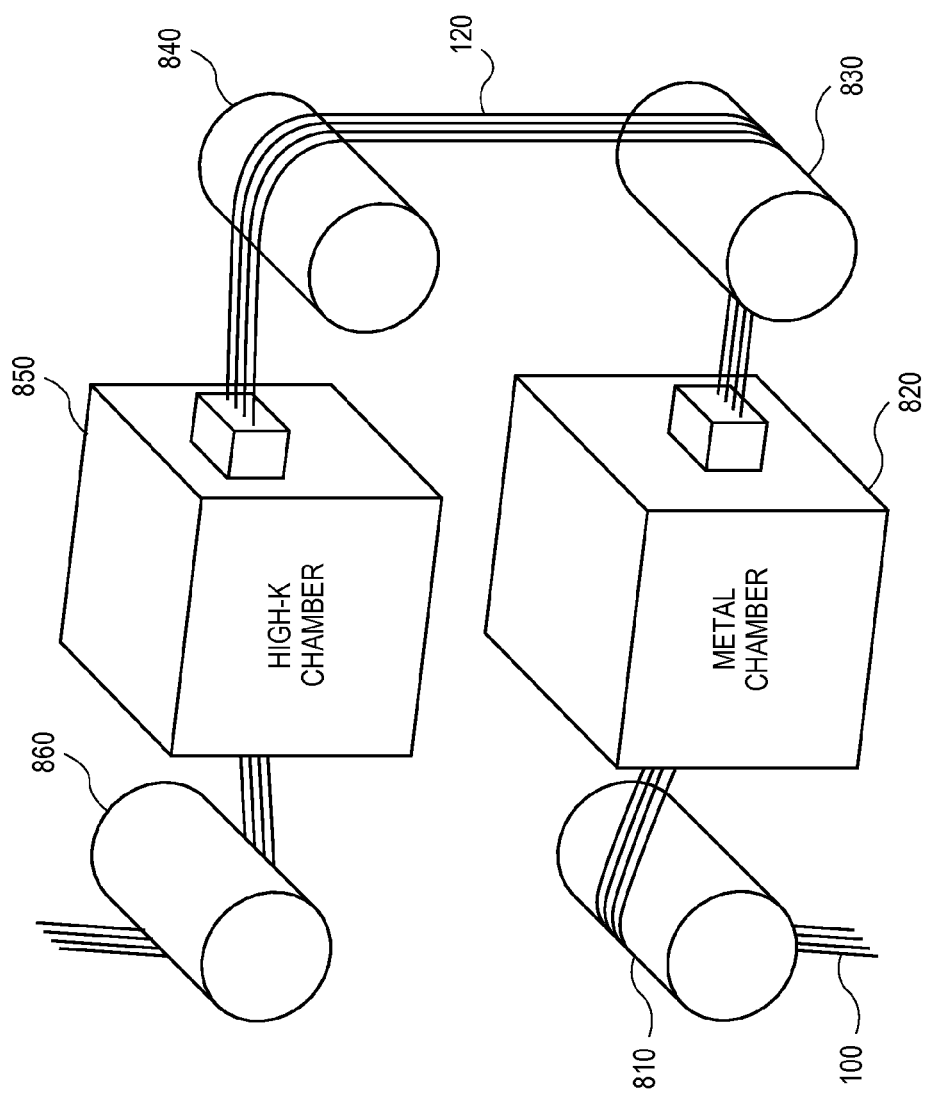
FIG. 10 is a perspective view illustration of a system for fabricating fiber components in accordance with embodiments of the invention.

FIG. 10 is a perspective view illustration of a system for fabricating fiber components in accordance with embodiments of the invention. As shown, a plurality of fibers 100 are simultaneously passed through the system, to significantly reduce the cost of the process.

Figure 12:
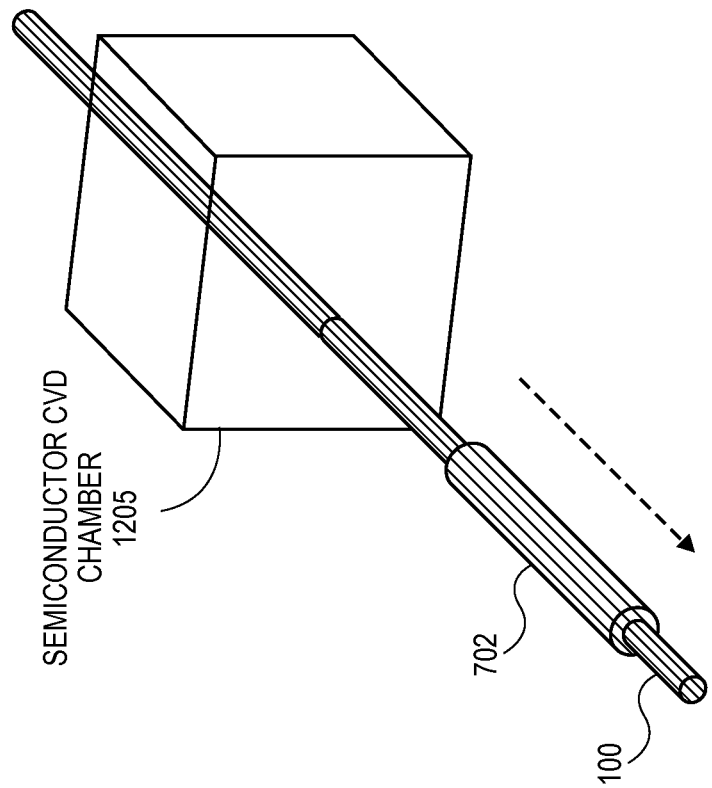
FIGS. 11-18 are perspective view illustrations of a system and method for fabricating a multi-component fiber in accordance with embodiments of the invention.
Figure 11:
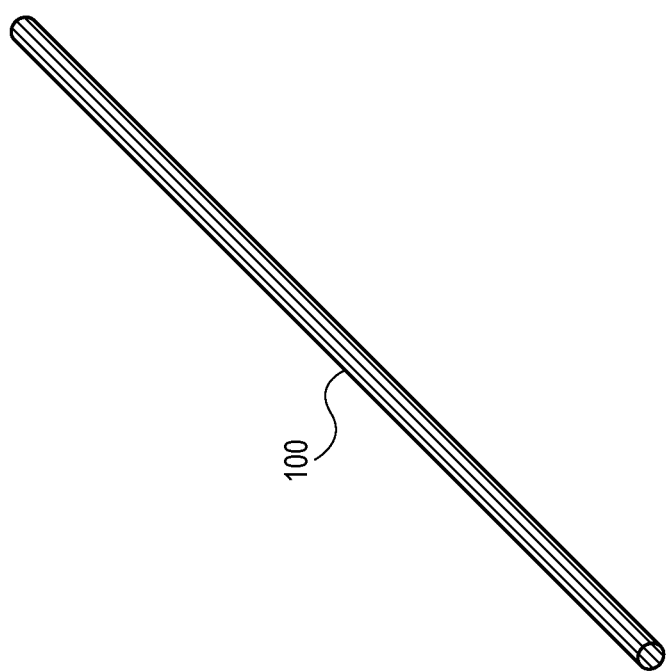
Figure 13:
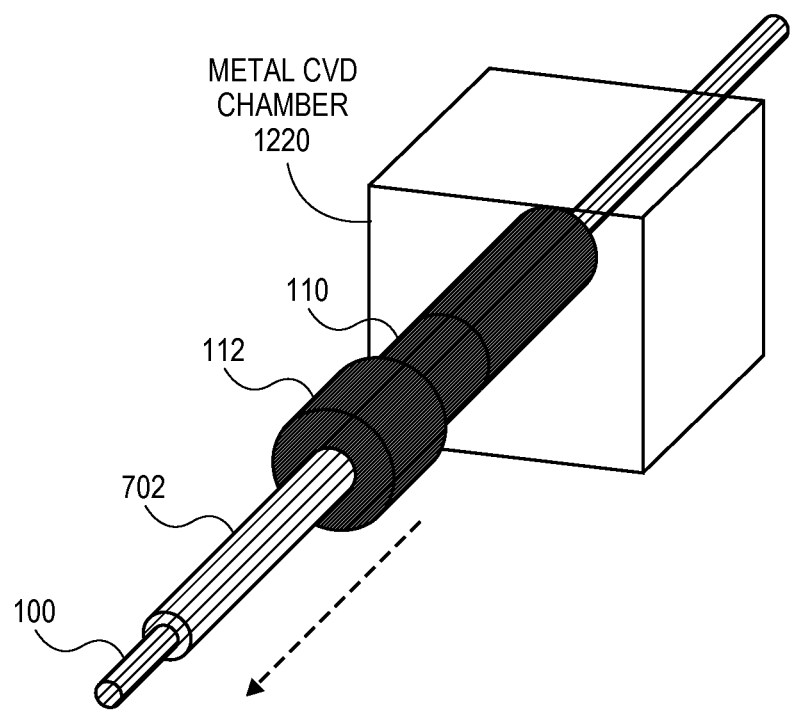

Referring now to FIGS. 11-18 perspective view illustrations are provided of a system and method for fabricating a multi-component fiber in accordance with embodiments of the invention. In an embodiment, the method begins with a fiber 100. Referring to FIG. 12, a semiconducting deposition chamber 1205 is turned on and a portion of the fiber 100 is drawn through the semiconducting deposition chamber 1205 to deposit semiconducting coating 702 on fiber 100 where a pass transistor is to be formed. The semiconducting deposition chamber 1205 is then turned off when passing the portion of fiber 100 on which a capacitor will be formed. Referring to FIG. 13, the fiber is then drawn through a metal deposition chamber 1220 to deposit an M1 coating 110 on the fiber 100. As shown the chamber 1205 is turned on prior to drawing all of the semiconducting coating 702 through the chamber so that a portion 112 of the M1 coating 110 overalaps the semiconducting coating 702 to form a contact. The chamber 1205 then remains on as the remainder of the capacitor part of the multi-component fiber is moves through the chamber 1205.

Figure 14:
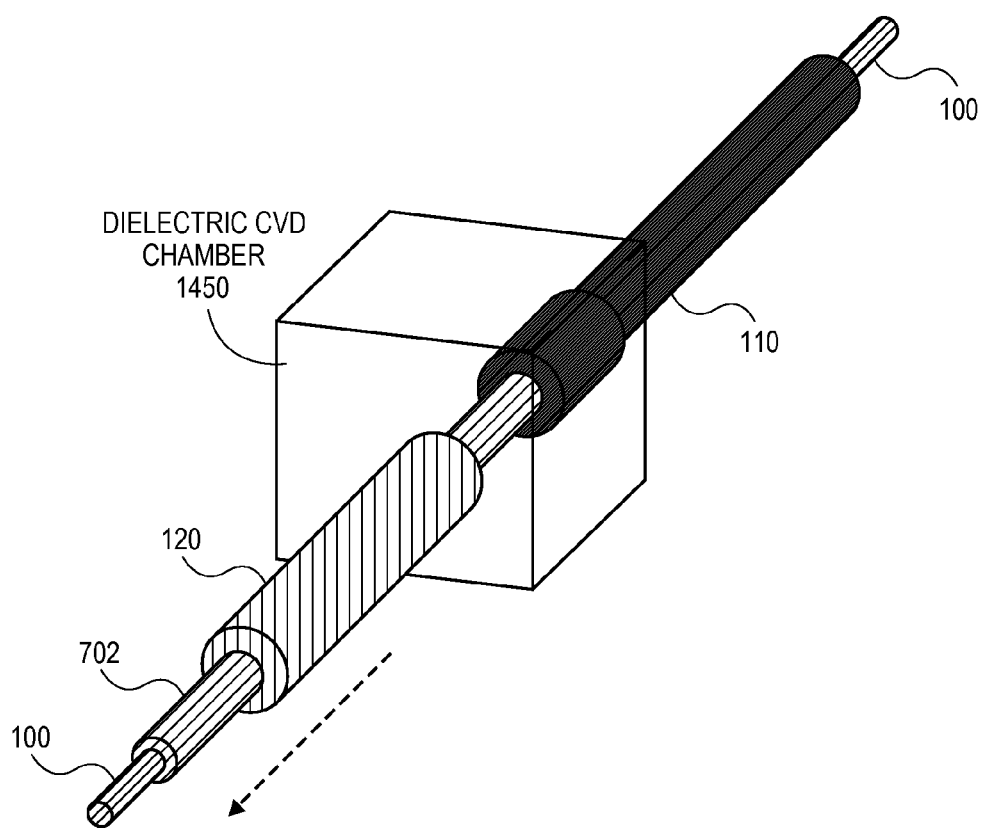
Figure 15:
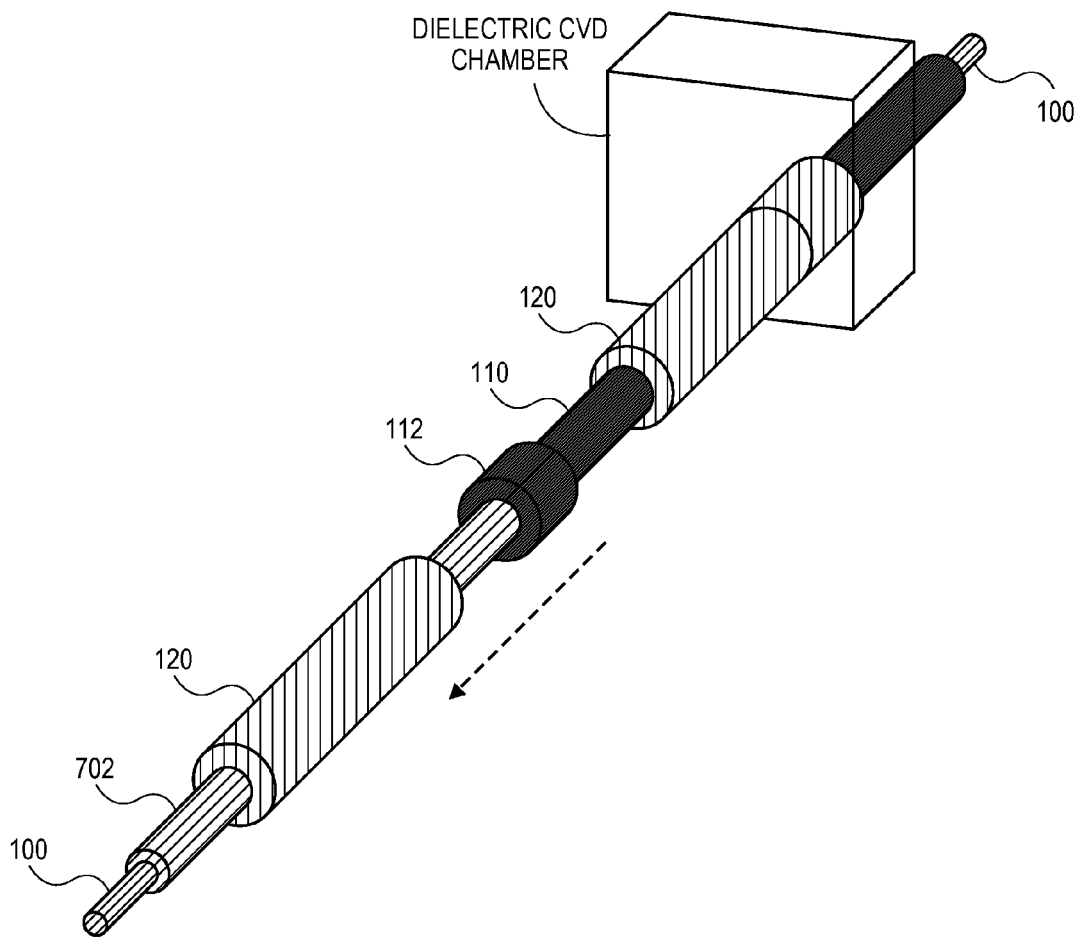

Referring now to FIGS. 14-15 the fiber is pulled through a dielectric deposition chamber 1450. In the embodiment illustrated, the dielectric deposition chamber 1450 is turned on momentarily and then turned off while the semiconducting coating 702 is within the chamber so that an E1 coating 120 is formed only on the semiconducting coating 702, with proximal and distal portions of the semiconducting coating 702 not being covered by the E1 coating 120. With the dielectric deposition chamber 1450 off, the fiber moves continues to move through until the M1 coating 110 of the capacitor part is within the chamber, and the chamber is turned on again to deposit the E1 coating 120 on the M1 coating 110 of the capacitor part. The chamber may then be turned off prior to the distal end of the M1 coating 110 entering the chamber.

Figure 16:
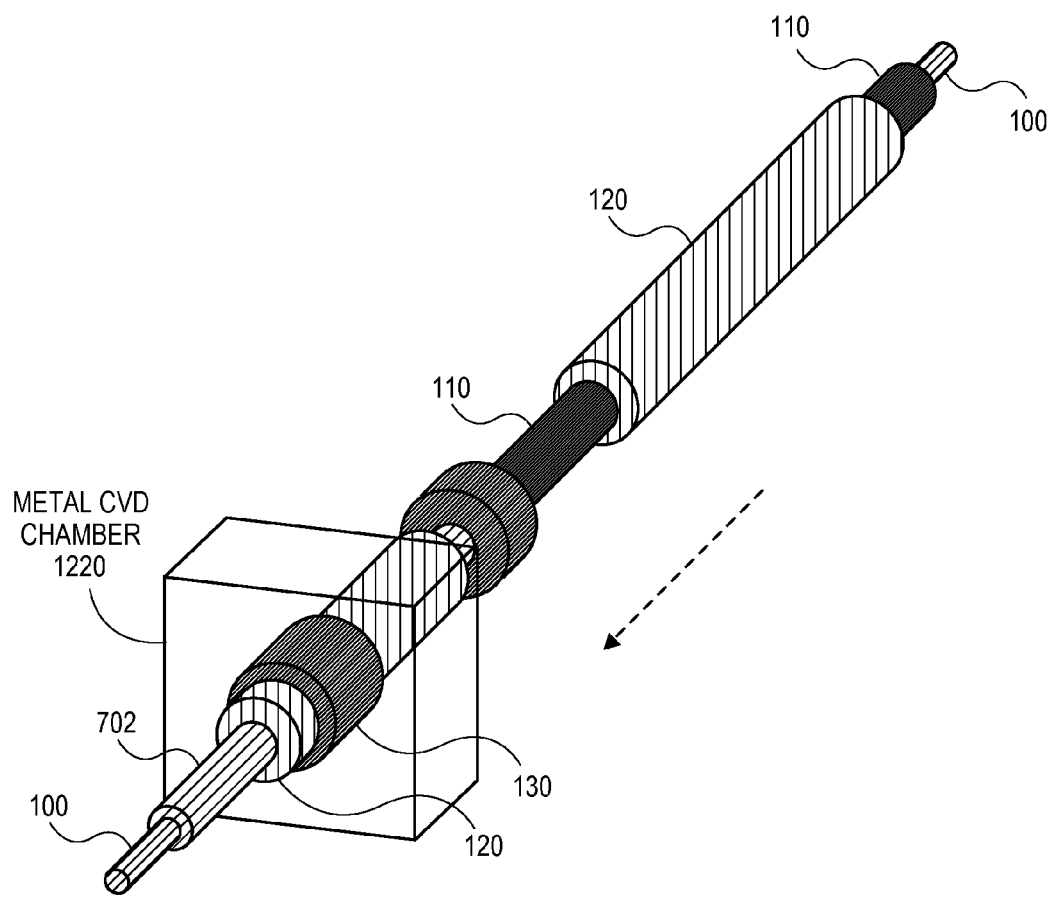
Figure 17:
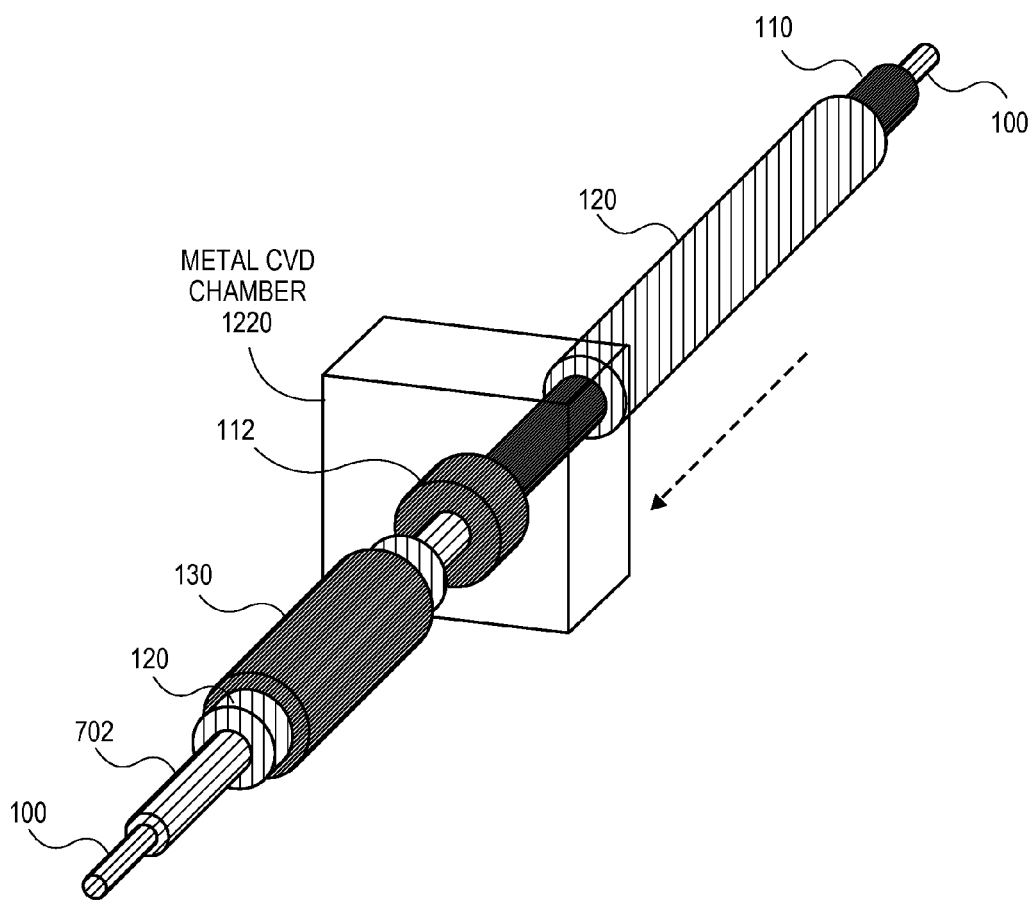
Figure 18:
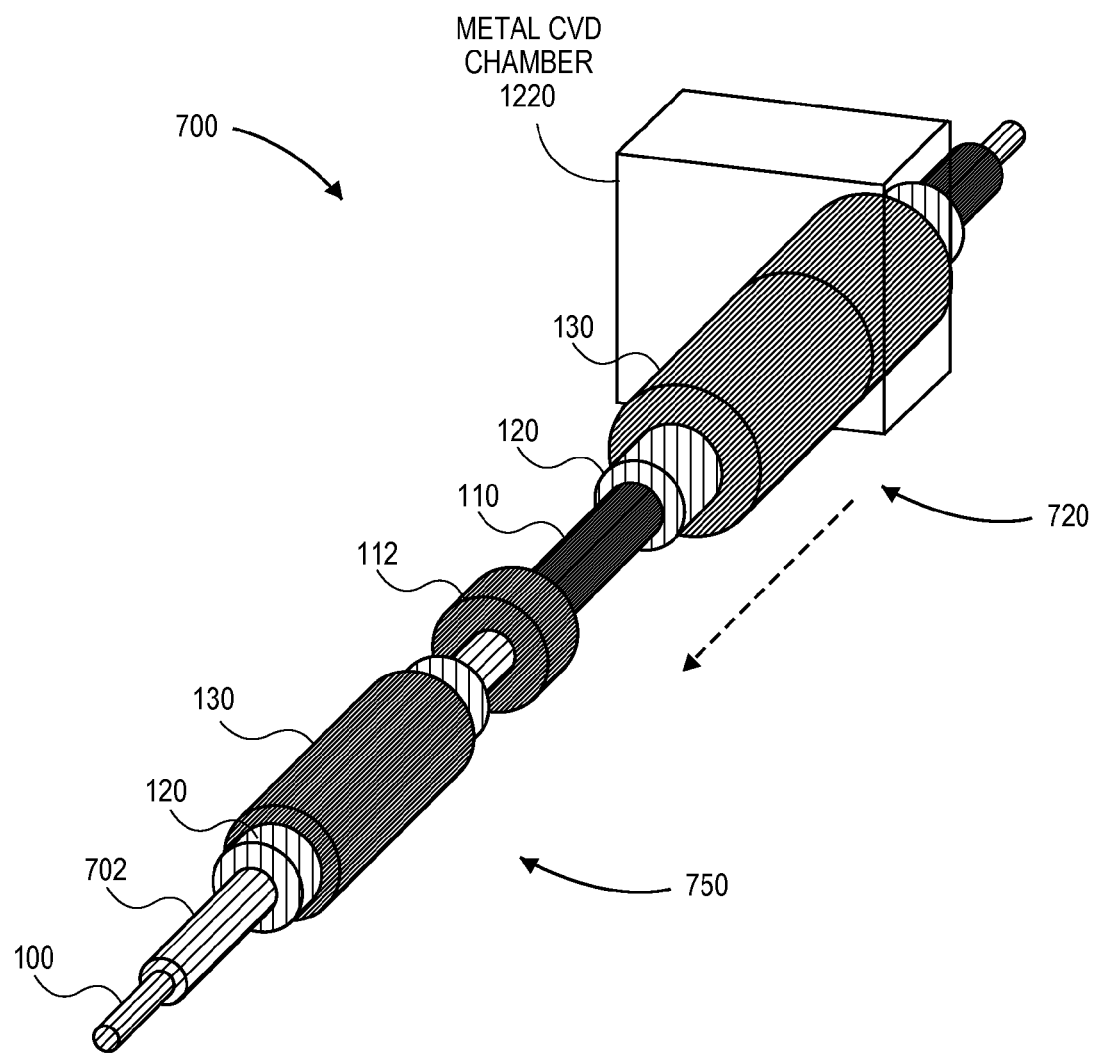

Referring to FIGS. 16-18 the fiber is then pulled through a metal deposition chamber 1220 to deposit M2 coatings 130. The metal deposition chamber 1220 may the same or different metal deposition chamber used to deposit M1 coatings 110. As shown the metal deposition chamber 1220 is turned on while passing the pass transistor E1 coating 120 through the chamber and turned off prior to passing the pass transistor E1 coating 120 completely through the chamber so that the M2 coating 130 is formed only on the E1 coating 120. Referring to FIG. 17, the metal deposition chamber 1220 remains off while the contact portion 112 of the capacitor M1 coating 110 moves through the chamber. Referring now to FIG. 18, the metal deposition chamber is turned back on once the E1 coating 120 enters the chamber. The chamber may then be turned off prior to the distal end of the E1 coating 120 entering the chamber so that the M2 coating 130 does not short to the M1 coating 110. In an embodiment, the multi-component fiber 700 illustrated in FIGS. 7A-7D is the resulting product.

FIGS. 19A-19H are cross-sectional side view illustrations of a method of forming inter-digitated capacitors in accordance with embodiments of the invention. The embodiments illustrated in FIGS. 19A-19H may also be fabricating using a similar deposition system as described with regard to FIGS. 8-18. The processing sequence may begin with depositing a M1 coating 110 around fiber 100 as illustrated in FIGS. 19A-19B. A E2 coating 120 is then deposited over M1 coating 110 with a distal end 122 of the E2 coating 120 surrounding a distal end 112 of the M1 coating 110. The proximal end 121 of the E2 coating 120 does not surround the proximal end 111 of M1 coating, which remains exposed.

Referring now to FIG. 19D, a M2 coating 130 is deposited over the distal end 122 of E1 coating 120 and a distal end 132 of M2 coating 130 on fiber 100. The proximal end 122 of the M2 coating 130 does not surround the proximal end 121 of E1 coating 120, which remains exposed. As illustrated, the M1, E1, M2 structure 110, 120, 130 forms an inter-digitated single wall capacitor structure.

A E2 coating 140 may then be deposited over the proximal end 131 of M2 coating 130. As illustrated in FIG. 19D, the proximal end 141 of the E2 coating 140 is not formed over the proximal end 111 of the M1 coating 110, nor is the distal end 142 of the E2 coating 140 formed over the distal end 132 of the M2 coating 130.

Referring now to FIG. 19F a M3 coating 150 is deposited over the proximal end 141 of E2 coating 140, with the proximal end 151 formed on the M1 coating 110, shorting the M1 and M3 coatings 110, 150 together. As illustrated, the distal end 152 of the M3 coating 150 is not formed over the distal end 142 of the E2 coating 140. As illustrated, the M1, E1, M2, E2, M3 structure 110, 120, 130, 140, 150 forms an inter-digitated double wall capacitor structure.

A E3 coating 160 may then be deposited over the proximal end 151 and distal end 152 of the M3 coating 150. As illustrated in FIG. 19G, the distal end 162 of the E3 coating 160 is not formed over the distal end 132 of the M2 coating 130. Referring now to FIG. 19H, a M4 coating 170 is deposited over the distal end 162 of the E3 coating 160, with the distal end 171 of the M4 coating 170 formed on the M2 coating 132, shorting the M2 and M4 coatings 120, 160 together. As illustrated, the proximal end 171 of the M4 coating 170 is not formed on the M1 coating 110. As illustrated, the M1, E1, M2, E2, M3, E3, M4 structure 110, 120, 130, 140, 150, 160, 170 forms an inter-digitated triple wall capacitor structure.

Figure 20:
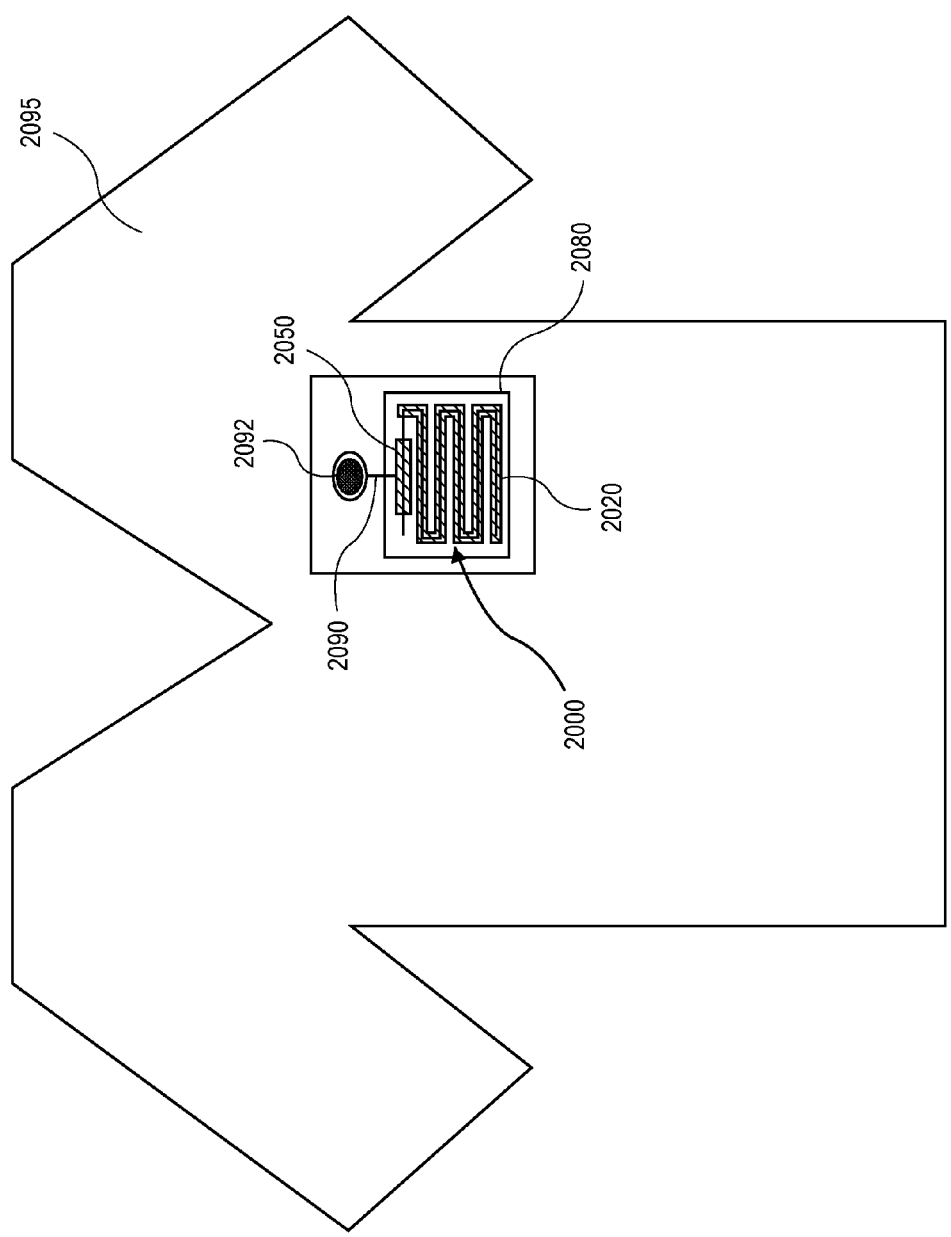
FIG. 20 is a schematic illustration of a multi-component fiber integrated with a wearable electronic device in accordance with embodiments of the invention.

FIG. 20 is a schematic illustration of a multi-component fiber integrated with a wearable electronic device in accordance with embodiments of the invention. In an embodiment, a portable electronics device 2092 is connected to or embedded in a textile product 2095 such as clothing, handbag, or wearable accessory. A variety of portable electronics devices 2092 are envisioned in accordance with embodiments of the invention, such as, but not limited to cameras, phones, and biomedical devices such as a heart rate monitor or device for checking insulin levels. The portable electronics device is connected to a fiber component 2000, which may be any of the charge storage fibers, pass transistor/sensor fibers, or multi-component fibers described herein. In the particular embodiment illustrated, a wire 290 connects the portable electronics device 2092 to a multi-component fiber 2000 including a pass transistor 250 and capacitor 2020. For example, the wire 290 may be electrically connected to the gate of the pass transistor 250. In an embodiment, the wire 290 can turn the gate on and off by receiving a signal from the portable electronics device 2092, or alternatively an radio-frequency identification (RFID) device. In another embodiment, the gate may be turned on and off by changes in the environment as sensed by a dielectric layer in the pass transistor 250 (sensor). As described above with regard to FIGS. 7B-7D, when the gate is turned on electric current may flow to charge the capacitor 2020. Charge will be stored in the capacitor 2020 when the gate is off, and electric current may also flow from the capacitor 2020 to the portable electronics device 2092 when the portable electronics device needs charging.

The fiber component 2000 may be attached to the textile-based product in a variety of manners. For example, the fiber component 2000 can be used to make the textile-based product. The fiber component 2000 can be woven into the textile-based product. The fiber component 200 can be sewn onto the textile-based product, or ironed onto the textile-based product. For example, as illustrated in FIG. 20, the fiber component can be a patch 2080 which is woven into the textile-based product, sewn onto the textile-based product, or ironed onto the texile based product. The fiber component 2000 can be attached to the textile-based product in a variety of additional manners.

Although the present invention has been described in language specific to structural features and/or methodological acts, it is to be understood that the invention defined in the appended claims is not necessarily limited to the specific features or acts described. The specific features and acts disclosed are instead to be understood as particularly graceful implementations of the claimed invention useful for illustrating the present invention.

What is claimed is:

1. A charge storage fiber comprising:
    a flexible electrically conducting fiber, wherein the flexible electrically conducting fiber comprises a flexible insulating fiber;
    a first metal (M1) coating on the flexible electrically conducting fiber;
    a dielectric (E1) coating on the flexible electrically conducting fiber, wherein the dielectric (E1) coating is on the first metal (M1) coating and surrounds a distal end of the first metal (M1) coating;
    a second metal (M2) coating on the dielectric coating, wherein the second metal (M2) coating surrounds a distal end of the dielectric (E1) coating and is electrically isolated from the first metal (M1) coating;
    a second dielectric (E2) coating on the second metal (M2) coating and surrounding a proximal end of the second metal (M2) coating; and
    a third metal (M3) coating on the second dielectric (E2) coating and surrounding a proximal end of the second dielectric (E2) coating, wherein the third metal (M3) coating is electrically isolated from the second metal (M2) coating.

2. The charge storage fiber of claim 1, wherein the first metal (M1) coating is longer than the dielectric (E1) coating.

3. The charge storage fiber of claim 2, wherein the dielectric (E1) coating is longer than the second metal (M2) coating.

4. A charge storage fiber comprising:
    a flexible electrically conducting fiber, wherein the flexible electrically conducting fiber comprises a flexible insulating fiber;
    a first metal (M1) coating on the flexible insulating fiber;
    a dielectric (E1) coating on the first metal (M1) coating;
    a metal (M2) coating on and surrounding at least a portion of the dielectric coating;
    a second dielectric (E2) coating on the metal (M2) coating; and
    a third metal (M3) coating and surrounding at least a portion of the second dielectric (E2) coating.

5. The charge storage fiber of claim 4, wherein the third metal (M3) coating is in electrical contact with the first metal (M1) coating.

6. The charge storage fiber of claim 4, wherein the second metal (M2) coating is electrically isolated from the first metal (M1) coating and the third metal (M3) coating.

7. The charge storage fiber of claim 1, wherein the flexible electrically conducting fiber is a flexible metal wire, wherein the dielectric (E1) coating is on the flexible metal wire.

8. The charge storage fiber of claim 1, wherein the flexible electrically conducting fiber is a flexible semiconducting wire.

9. The charge storage fiber of claim 8, further comprising a first metal (M1) coating on the flexible semiconducting wire, wherein the dielectric (E1) coating is on the first metal (M1) coating.

10. The charge storage fiber of claim 1, wherein the flexible electrically conducting fiber comprises a flexible fiber and a semiconducting coating on the flexible fiber.

11. The charge storage fiber of claim 1, wherein the charge storage fiber is attached to a textile-based product.

12. The charge storage fiber of claim 11, wherein the charge storage fiber is woven into a textile-based product.

13. The charge storage fiber of claim 11, wherein the textile-based product is selected from the group consisting of clothing and a wearable accessory.

14. A charge storage fiber comprising:
a flexible electrically conducting fiber, wherein the flexible electrically conducting fiber comprises a flexible fiber and a semiconducting coating on the flexible fiber;
a first metal (M1) coating on the flexible electrically conducting fiber, wherein the first metal (M1) coating is on the semiconducting coating;
a dielectric (E1) coating on the flexible electrically conducting fiber, wherein the dielectric (E1) coating is on the first metal (M1) coating and surrounds a distal end of the first metal (M1) coating;
a second metal (M2) coating on the dielectric coating, wherein the second metal (M2) coating surrounds a distal end of the dielectric (E1) coating and is electrically isolated from the first metal (M1) coating;
a second dielectric (E2) coating on the second metal (M2) coating and surrounding a proximal end of the second metal (M2) coating; and
a third metal (M3) coating on the second dielectric (E2) coating and surrounding a proximal end of the second dielectric (E2) coating, wherein the third metal (M3) coating is electrically isolated from the second metal (M2) coating.

* * * * *